United States Patent [19]

Mauer et al.

[11] 4,149,902
[45] Apr. 17, 1979

[54] FLUORESCENT SOLAR ENERGY CONCENTRATOR

[75] Inventors: Paul B. Mauer; Gene D. Turechek, both of Rochester, N.Y.

[73] Assignee: Eastman Kodak Company, Rochester, N.Y.

[21] Appl. No.: 819,207

[22] Filed: Jul. 27, 1977

[51] Int. Cl.² .................. H01L 31/04; G02B 5/14
[52] U.S. Cl. .................. 136/89 PC; 136/206; 126/270; 126/271; 428/913; 350/96.10; 250/227; 250/361 R; 250/367; 250/458; 250/486; 250/487
[58] Field of Search .......... 136/89 PC, 89 HY, 206; 126/270, 271; 250/361 R, 367, 458, 460, 486–488, 227; 428/913; 350/96.10; 427/64, 157; 252/301.35

[56] References Cited

U.S. PATENT DOCUMENTS

| Re. 28,883 | 6/1976 | Willdorf | 156/71 |
|---|---|---|---|
| 2,765,411 | 10/1956 | Kerr | 250/71 |
| 3,317,738 | 5/1967 | Piepenbrink et al. | 250/227 |
| 3,426,212 | 2/1969 | Klaas | 250/226 |
| 3,484,607 | 12/1969 | McGuire et al. | 250/71 |
| 3,541,374 | 11/1970 | Lidoski et al. | 313/108 |
| 3,959,655 | 5/1976 | Mauer | 250/474 |
| 4,039,838 | 8/1977 | Di Piaza | 250/483 |

OTHER PUBLICATIONS

P. B. Mauer et al., "Fluorescent Concentrator for Solar Energy Collection" *Research Disclosure*, vol. 129, p. 20 (1975).
W. H. Weber et al., "Luminescent Greenhouse Collector For Solar Radiation", *Applied Optics*, vol. 15, pp. 2299–2300 (1976).

*Primary Examiner*—Aaron Weisstuch
*Attorney, Agent, or Firm*—D. R. Arndt

[57] ABSTRACT

Apparatus for concentrating radiant energy such as solar radiation, collected over a large area, to a smaller area for more efficient conversion of the radiant energy to a more useful form of energy. Fluorescent material in a thin film form is optically bonded by an adhesive or viscous, transparent medium to a massive slab of transparent material such as glass or plastic. Energy conversion devices, such as photovoltaic cells, are disposed around the edges of the slab.

8 Claims, 4 Drawing Figures

FLUORESCENT SOLAR ENERGY CONCENTRATOR

BACKGROUND OF THE INVENTION

1. Field of the Invention

The invention relates to an apparatus for concentrating radiant energy such as solar radiation, collected over a large area into a smaller area for more efficient conversion of the radiant energy to a more useful form of energy. More particularly, it relates to the use of fluorescent material in a thin film form which is optically bonded by an adhesive to a massive slab of transparent material such as glass or plastic. The incident solar radiation is absorbed by the fluorescent material and re-emitted within the slab to be trapped by the phenomenon of total internal reflection and transmitted to the edges of the slab where it escapes to impinge upon an energy conversion device.

2. Description of the Prior Art

The use of solar energy as a power source has not been cost-competitive with other power-generating methods because of the high cost of solar cells and other solar energy concentrators. It is this prohibitively high cost that has made the typical "flat-array" or non-focusing solar generator impractical even though it has the advantages of being simple and reliable.

In an attempt to lower costs by reducing the cell area, reflective or refractive optics have been employed to concentrate the sunlight falling on a relatively large area of the optics into a smaller area where fewer cells may convert the concentrated radiant energy. However, collectors which re-direct sunlight by focusing require either that they be moved to accurately track the sun's apparent motion, or that they be designed for and positioned at some comprise fixed position. In addition, collectors of this type are not effective to collect diffused radiation encountered when skies are overcast or hazy.

Use of a fluorescent concentrator of the type disclosed in Volume 129 of Research Disclosure published January, 1975 combines the advantages of both types of converters. One disclosed arrangement comprises a multilayer structure wherein a chamber containing fluorescent dyes is formed by two sheets of highly transparent glass with layers between the glass being separated by a pair of transparent spacers. A first dye solution is contained in the chamber formed by the transparent spacers. A second dye solution is contained in each of the upper and lower chambers formed between one of the glass plates and one of the transparent spacers. The fluorescent dye materials are chosen so that the second dye material absorbs the fluorescence of the first dye. The dye solutions in each of the chambers may be replenished and removed via a system of conduits so that any dye solution may be flushed and replaced without disassembly of the cell when deterioration of the dye is observed. Sunlight that penetrates the glass sheets is absorbed by the fluorescent dye and re-emitted. A large percentage of the re-emitted light piped to the edge of the collector where it impinges on an energy conversion device.

SUMMARY OF THE INVENTION

The present invention incorporates fluorescent material in a thin film which is optically contacted with a slab of transparent material such as glass or plastic by an adhesive or a viscous transparent medium. The thin film of fluorescent material may be a coating of organic dye with polymer binder on a transparent plastic substrate. Disposed around the edges of the slab in optical contact therewith are arrays of energy converters such as photovoltaic cells.

In a preferred embodiment, several layers of thin sheets containing fluorescent dyes are bonded to the transparent slab. The inner-most layers contain a first dye which would absorb shorter wavelengths than the second dye contained in the outermost layer. Such an arrangement has the advantage that all the fluorescence of the inner layers must pass through the outer layers before it can escape, thereby reducing the amount of radiation that would normally escape from the inner layer through the solid angle $\theta$ since a portion of that radiation will be absorbed by an outer layer.

BRIEF DESCRIPTION OF THE DRAWINGS

In the detailed description of the preferred embodiments presented below, reference is made to the following drawings wherein.

DESCRIPTION OF THE PREFERRED EMBODIMENT

Figure 1:
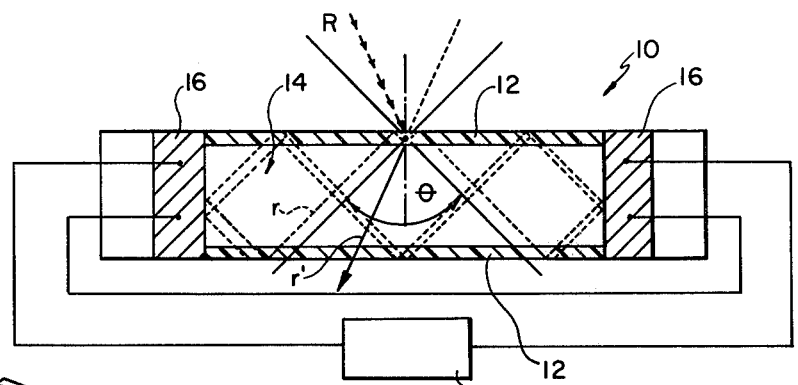
FIG. 1 is a cross section of a solar collector having a single fluorescent layer on the top and bottom of the transparent slab according to the present invention.

Reference is now made to FIG. 1 which illustrates a solar collector shown generally as 10 wherein a thin layer or sheet of fluorescent material 12 is optically contacted with a relatively thick slab 14 of highly transparent material such as glass or plastic. Disposed around the edges of the slab in optical contact therewith are arrays of energy converters 16, such as photovoltaic cells, the output of which is connected to a load 18 such as a motor or battery charging circuit.

Radiant energy, either direct, as from the sun on a clear day, or diffused, as encountered on overcast days, is represented by the ray R which is incident upon the surface of the fluorescent layer 12. The fluorescent material absorbs some of the radiation and then re-emits radiation in a longer wavelength in all directions as indicated by the dotted lines r. All the re-emitted radiation falling outside of a cone having an angle $\theta$ will be trapped by the phenomenon of total internal reflection and transmitted to the edges of the slab 14 where it is converted by energy converters 16 to another form of energy such as heat or electricity.

Any of the re-emitted radiation falling within the cone having an angle $\theta$ will escape through the surface of the solar collector 10; such a ray r' is shown as an example. Although the angle $\theta$ is on the order of 90°, a relatively small portion of the re-emitted light is lost through the surface because the area of the two cap-shaped segments 19 (FIG. 3) of a sphere 17 (the center of the sphere being at the point of fluorescence) subtended by the 90° cones is a small percentage (about ¼) of the total surface area of the sphere.

Figure 3:
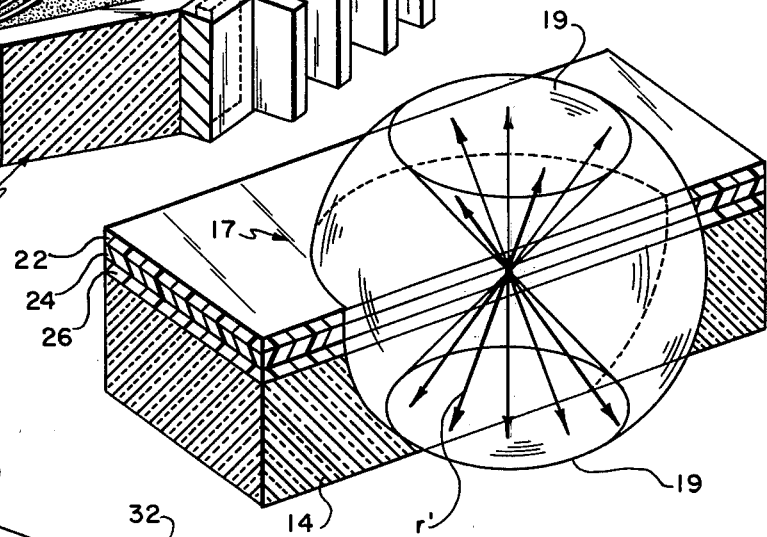
FIG. 3 is an enlarged, perspective view in partial cross section of the solar collector shown in FIG. 2 and illustrates the fluorescent layers in more detail.

FIG. 3 illustrates diagramatically how each excited dye molecule's fluorescence is emitted into spherical volumes surrounding the molecule. A substantial fraction of this radiation, after passing through the glass and dye, will strike the glass-air interface at an angle of incidence greater than the critical angle $\theta$ and thus will be totally internally reflected. This radiation, trapped by total internal reflection will be light-piped to the edges of the glass/dye sandwich. The fraction of emitted photons thus trapped and light-piped to the edges of the sandwich will depend upon the index of refraction of the glass and dye layer, the transmittance of the glass for the wavelengths of the fluorescence, reabsorption losses in the dye, and the geometry of the cell.

When the trapped radiation arrives at the edge of the dye cell 20, it will strike the solar cells 28 (FIG. 2) which are in contact with the edge. The fraction of this radiation which is converted to electrical power will depend upon the reflection losses at the glass/photocell interface and the quantum efficiency of the solar cell 28 for the range of wavelengths associated with the trapped radiation.

The geometrical concentration factor for the collector is approximately the surface area of the collector that is exposed to sunlight, divided by the area of the edges of the collector. The concentration factor represents the factor by which energy density along the edges of the cell would exceed the energy density incident on the surface of the cell, assuming that all the incident energy is light-piped to the edges. For example, for a cell having a surface area of 1 square meter and a thickness of one centimeter, the ratio of surface area to edge area is 25:1. In such a square collector, the energy converters near the center of the edges would receive more energy than those at the corners. To equalize the amount of energy received by the energy converters, mirrors 32 (FIG. 2) may be placed on two opposite edges of the collector (with their reflective surfaces toward the slab) with the energy conversion devices arranged on the two other edges of the geometric concentrator. With these mirrors, the concentration ratio would then be approximately doubled to about 50:1.

Of the energy emitted by the fluorescent material, the fraction which, ideally, would be light-piped to the edges of the collector is given by:

$$F = \sqrt{1 - (n_1/n_2)^2}$$

where F is the fractional efficiency of the collector, $n_1$ is the index of refraction of the surrounding medium; and $n_2$ is the index of refraction of the fluorescent sheet. If $n_2$ is 1.5 and the surrounding medium is air ($n_1 = 1$), about 75% of the energy emitted by the fluorescent material is light-piped to the edge of the collector.

Solar cells presently in use have a peak response to light having a wavelength on the order of 900 n.m. with the typical peak conversion efficiency being about 40%. Ideally, a fluorescent concentrator is required to operate utilizing terrestrial solar radiation having a spectral distribution beginning at about 400 n.m., with 70% of the total incident energy at wavelengths between 400 n.m. and 850 n.m. An ideal fluorescent dye for use in a solar energy concentrator would absorb all the incident energy between 400 n.m. and 850 n.m. and re-emit it with 100% quantum efficiency in a narrow band centered at 900 n.m., the wavelength of peak response for silicon solar cells. When all of the above factors are considered together, the overall ideal efficiency of a typical fluorescent concentrator in converting sunlight to electrical power can be expressed as:

Efficiency
= (Fraction of incident energy absorbed and emitted)
× (Fraction of emitted energy trapped)
× (Solar cell efficiency)
= 0.50 × 0.75 × 0.40
= 0.15

The achievable efficiency in an actual device may be appreciably lower when the transmission losses of the glass (slab material) are taken into account along with re-absorption of the emitted radiation by the dye. In practice, efficiencies in the range of 1%–2% have been obtained using known dyes such as Rhodamine B for the outermost layers, with Coumarin 6 or Fluorescien for the inner layers.

With a total system efficiency in the range of 1% to 2% for a fluorescent concentrator of the type set forth herein, the fluorescent concentrator has been found to be cost competitive with presently available silicon photovoltaic cells employed alone. For example, a fluorescent concentrator having an area of about one square foot with a silicon photovoltaic cell array located along the edges of the concentrator, produces an output of about ½ watt. When the same silicon cell array alone is exposed to the same intensity of sunlight, the output of the array is about ¼ watt. The silicon cell array costs about five dollars. The materials used to construct the one square foot fluorescent concentrator cost about two dollars. Thus, the fluorescent concentrator used to produce the ½ watt output cost a total of seven dollars, whereas to obtain the same output with silicon cells alone would require two cell arrays costing a total of ten dollars.

In accordance with the present invention, a layer of fluorescent dye may be coated on a thin transparent sheet of plastic, or a second alternative is that the dye may be dispersed throughout the sheet of plastic; using a third arrangement, the fluorescent dye could be coated directly on the slab material. The former has the advantage that the fluorescent coating could be mass-produced using modern roll coating techniques which would have a significant impact on reducing the cost. Such as arrangement would have the further advantage of providing easy periodic replenishment of the fluorescent material by removing the old sheet and optically bonding the new sheet to the slab. This periodic replenishment is required because all known fluorescent materials deteriorate with age. Since many fluorescent dyes absorb only a limited bandwidth of solar spectrum, a number of such dyes may be used to provide a more efficient solar energy collector. This may be accomplished by using multiple layers of the coated sheets or coating a plurality of layers on a single sheet similar to the way various light sensitive emulsions are coated on a substrate, one over another. Such a configuration is useful in the event that the dyes selected are chemically or physically incompatible. Using multilayer coating techniques, the dyes can be deposited in physically and chemically separate layers, yet remain strongly optically coupled.

Figure 2:
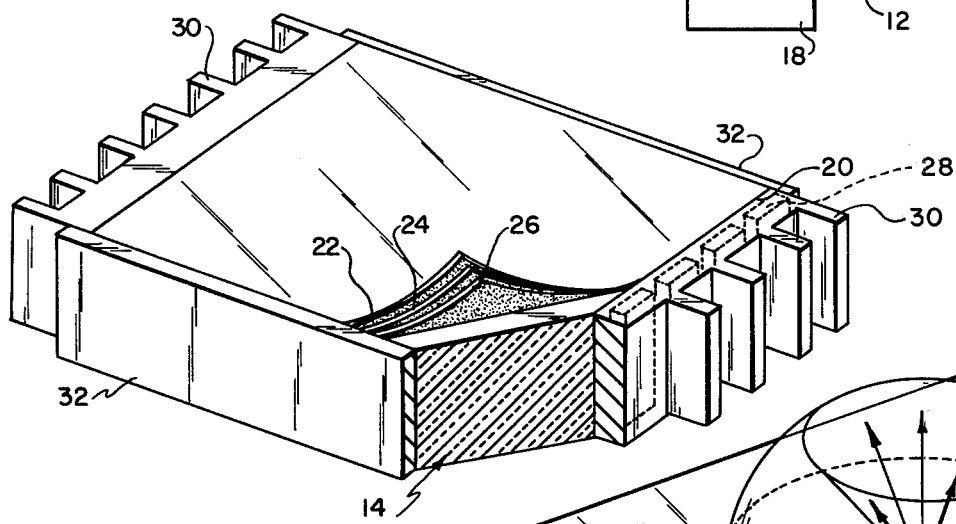
FIG. 2 is a perspective view, partially broken away showing a preferred embodiment of the invention which uses three fluorescent layers on the top of the transparent slab.

Such a structure is shown in FIGS. 2 and 3 wherein transparent glass or plastic (Plexiglas ™) 14 is coated with three layers 22, 24, and 26 of fluorescent dye material. The fluorescent dye material may be a coating of organic dye with a polymer binder on a transparent plastic substrate. Alternatively, thin layers of dye containing lacquer may be applied directly to the transparent glass or plastic by spraying, dipping, or brushing. These layers, if properly constituted, could be removed by mechanically stripping, or dissolved with a solvent, and restored in the field without dismantling the main photocell-light-piping-slab structure.

As shown in FIG. 3, a first fluorescent dye material is contained in layer 24 between layers 22 and 26 which contain a second dye material. Preferably, the first dye contained in the middle layer 24 will absorb a shorter wavelength of light than the second dye contained in layers 22 and 26. Using this arrangement, radiation which is trapped in the middle layer 24 is re-emitted at a longer wavelength which is absorbed in either layer 22 or 26, thus improving the efficiency of the collector. The multi-layer structure may be extended to provide as many fluorescent materials as necessary to absorb a larger fraction of the incident solar wavelengths.

The photovoltaic cells 28 shown in FIG. 2 are mounted on two edges of the collector and are provided with cooling fins 30 projecting from the back of their mounting. On the other two edges, mirrors 32 are provided to keep the light from escaping from these edges.

Figure 4:
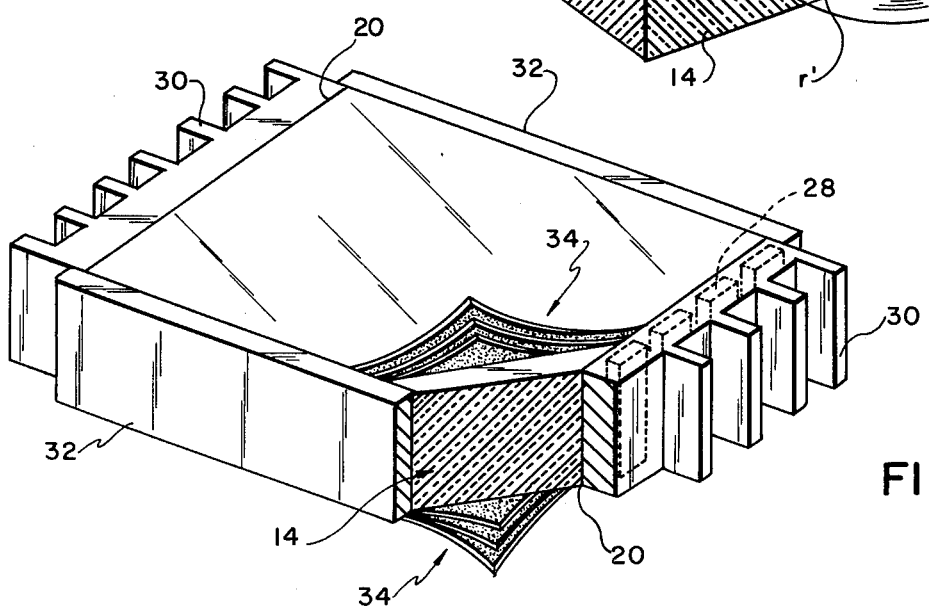
FIG. 4 is a perspective view similar to FIG. 2 and illustrates multilayer construction above and below the slab.

FIG. 4 illustrates a further embodiment of the invention wherein a plurality of thin fluorescent sheets 34 are optically contacted with both the upper and lower surfaces of a transparent slab 14. Optical contact is established by a fluid having the same index of refraction as the slab and the sheets. Once again, it is desirable that the dye layers near the center of the structure absorb a shorter wavelength of light than the outermost dye layers so that radiation which is trapped in the inner layers will be re-emitted at a longer wavelength which is then totally absorbed by the outer layers, thereby improving the efficiency of the collector. The refractive indices of the slab and the layers are chosen to be substantially equal.

The invention has been described in detail with particular reference to preferred embodiments thereof, but it will be understood that variations and modifications can be effected within the spirit and scope of the invention as described herein above and as defined in the appended claims.

We claim:

1. A solar energy concentrator and converter comprising:
    a slab of optically transparent material having major opposed face surfaces defining an edge surface;
    one or more removable layers of a first fluorescent dye disposed in optical contact with one or more of said face surfaces;
    one or more removable layers of a second fluorescent dye disposed in optical contact with at least one of said first fluorescent dye layers;
    said first fluorescent dye being capable of absorbing a shorter wavelength of light than said second fluorescent dye;
    the refractive indices of said slab and said layers being substantially equal; and
    radiation conversion means positioned along the edge surface of said slab.

2. The solar energy concentrator as set forth in claim 1 wherein optical contact is established by a fluid having the same index of refraction as said slab and said layers.

3. The solar energy concentrator as set forth in claim 1 wherein said second fluorescent dye absorbs a wavelength of light equal to the wavelength of light emitted by said first fluorescent dye.

4. The solar energy concentrator and converter of claim 1 wherein said radiation conversion means comprise at least one photovoltaic cell.

5. The solar energy concentrator and converter of claim 1 wherein said radiation conversion means comprise a plurality of photovoltaic cells.

6. A solar energy concentrator comprising:
    a generally flat slab or optically transparent material having a pair of parallel opposite face surfaces defining an edge surface;
    a sheet of fluorescent material substantially thinner than said slab, said sheet being in optical contact with one of said face surfaces of said slab and being strippable from said slab for replacement by another such sheet, the refractive index of said sheet being substantially equal to the refractive index of said slab;
    and a reflective material along a portion of said edge surface for reflecting internally-trapped radiation to the remaining portion of said edge surface; whereby incident solar radiation absorbed by the fluorescent material is re-emitted within the slab and trapped therein by the phenomenon of total internal reflection and is transmitted to the edges of the slab, where it escapes to impinge upon an energy conversion device.

7. A solar concentrator for receiving sunlight that illuminates a relatively large surface of said concentrator and for re-emitting, light of a narrower spectral range than the received sunlight and of a ligher unit intensity than the received sunlight, from a smaller surfce thereof, said solar concentrator comprising:
    a generally flat slab of optically transparent material having opposite first and second substantially parallel face surfaces and an edge of substantially smaller area than the area of said first face surface, whereby light entering said slab through said first face surface at less than the critical angle determined by the particular refractive index of said material is reflected internally between said face surfaces and is emitted from said slab along said edge;
    a thin layer of fluorescent material optically contacted with one of said face surfaces of said slab and adapted to re-emit in all directions light of a predetermined spectral range in response to illumination of said sheet by light having a broader spectral range than said re-emitted spectral range, said layer having a refractive index substantially equal to the refractive index of said slab, and means for separably bonding said layer to said one face surface, said layer thereby being easily removable for permitting a new layer of such material to be applied to that face surface in optical contact therewith.

8. A radiant energy concentrator for converting light that illuminates a relatively large face surface of said concentrator into light that is emitted from a smaller edge surface of said concentrator, said emitted light having a narrower spectral range and a higher unit area intensity than said illuminating light, said concentrator comprising:
    a generally flat slab of optically transparent material having opposite substantially flat, parallel face surfaces and an optically transparent edge, whereby light entering said slab through one of said face surfaces at less than the critical angle determined by the particular refractive index of said material is reflected internally between said face surfaces and is emitted from said slab along said edge;

a thin fluorescent sheet optically contacted with one of said face surfaces of said slab and adapted to re-emit in all directions light of a predetermined relatively narrow spectral range in response to illumination of said sheet by light of a broader spectral range, said sheet having a refractive index substantially equal to the refractive index of said slab; and means for separably bonding said sheet to one of said face surfaces of said slab in optical contact therewith such that said sheet can be easily removed and replaced with a new sheet of such material applied to that face surface in optical contact therewith, the area of said sheet in optical contact with that face surface being substantially larger than the area of said edge.

* * * * *

UNITED STATES PATENT OFFICE
CERTIFICATE OF CORRECTION

PATENT NO. : 4,149,902
DATED : April 17, 1979
INVENTOR(S) : Paul B. Mauer    Gene D. Turechek It is certified that error appears in the above-identified patent and that said Letters Patent are hereby corrected as shown below:

Column 1, line 36  "comprise" should read --compromise--

Signed and Sealed this

*Eighteenth* Day of *September 1979*

[SEAL]

*Attest:*

LUTRELLE F. PARKER

*Attesting Officer*    *Acting Commissioner of Patents and Trademarks*